(12) United States Patent  (10) Patent No.: US 6,587,342 B1
Hsu  (45) Date of Patent: Jul. 1, 2003

(54) SNAP COUPLING COOLING FAN MODULE

(75) Inventor: Cheng-Chung Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/200,144

(22) Filed: Jul. 23, 2002

(51) Int. Cl.[7] ................................................ H05K 7/20
(52) U.S. Cl. ...................... 361/695; 361/690; 165/80.3; 415/213.1; 174/16.1
(58) Field of Search ......................... 361/687, 690–695; 174/16.1, 16.3; 257/718; 165/80.3, 122, 126; 312/223.1, 223.2; 454/184; 415/213.1

(56) References Cited

U.S. PATENT DOCUMENTS

| | | | | |
|---|---|---|---|---|
| 5,557,499 A | * | 9/1996 | Reiter et al. | 361/685 |
| 5,562,410 A | * | 10/1996 | Sachs et al. | 415/213.1 |
| 5,822,186 A | * | 10/1998 | Bull et al. | 361/695 |
| 5,963,424 A | * | 10/1999 | Hileman et al. | 361/695 |
| 6,040,981 A | * | 3/2000 | Schmitt et al. | 361/695 |

* cited by examiner

*Primary Examiner*—Boris Chervinsky
(74) *Attorney, Agent, or Firm*—Birch, Stewart, Kolasch & Birch, LLP

(57) ABSTRACT

A snap coupling cooling fan module is adopted for use on a computer system to provide the heat dissipation apparatus required by the computer system. The cooling fan module includes a fan lid, which has one side pivotally engaged with a frame and another side latched on a board extending from the frame by means of a latch hook so that a space is formed to house the fans. Matching anchor stubs and latch stubs are formed to clamp and anchor the fans without screws. Installation and disassembly may thus be done faster to save assembly and repair costs.

8 Claims, 4 Drawing Sheets

SNAP COUPLING COOLING FAN MODULE

FIELD OF THE INVENTION

The invention relates to a snap coupling cooling fan module adopted for use on computer systems, and particularly a snap coupling module for anchoring fans onto a server system without using screws.

BACKGROUND OF THE INVENTION

Servers are widely used in network systems to provide services for terminals at the client ends, such as disk storage or printing services for users. The most commonly used servers are file servers and printer servers. A large server system is generally a system including many servers. The demand for large server systems has continuously grown in recent years. As users do not want to allocate too much space to house computers, the demand for large servers increases constantly.

The server system is a high level system in computer systems. The biggest issue in the computer systems is heat dissipation. As the server systems have to process a great number of tasks, their reliability is more critical than general computer systems. In order to maintain the normal operation of the server systems, heat must be dissipated effectively. To meet this end, one of the approaches usually adopted is to increase the number of cooling fans. A modular design has been developed, as shown in FIG. 1. The cooling fan is mounted onto a fan opening 21 of an anchor dock 20. A plurality of bolts 12 are used to run through anchor holes located at the periphery of the fan 11 and the anchor dock 20 and to engage with nuts 13 to fasten the fan 11 to the anchor dock 20. A fan guarding grid 14 may be disposed at the inner side to prevent external articles from entering into the blade section of the fan 11 or the computer or server systems to avoid damage. They are installed at desired locations of the server systems.

While this design is simple and does not cost very much in terms of material consumption, it is only suitable for general computer systems that have one or two cooling fans. For server systems that must use four, or five or even more cooling fans, installation becomes troublesome. For instance, a general cooling fan requires four bolts to anchor and install, so four cooling fans require sixteen bolts for fastening. This creates a big challenge for installation. Moreover, the server systems generally operate twenty-four hours a day. Fans are prone to malfunction and require frequent repairs, maintenance and replacements. The increasing number of components and tedious fastening cause a lot of waste in manpower and operation.

SUMMARY OF THE INVENTION

The invention aims at providing a snap coupling cooling fan module to resolve the problems mentioned above. The snap coupling design of the invention does not need screw bolts for fastening and can save assembly time and the cost of components.

The primary object of the invention is to provide a snap coupling fan module adopted for use on computer systems, and particularly to server systems that require many cooling fans. The cooling fan module of the invention includes a frame, at least one fan lid and a board extending from the frame. The frame includes a connector to establish electric connection with a computer system. The board is extended from the frame and has a plurality of fan openings. The fan lid has one side pivotally engaged with the frame and another side selectively engaged with the board such that a housing space is formed between the fan lid and the board for holding a plurality of cooling fans. The board around the fan opening has anchoring stubs and the fan lid has corresponding coupling stubs to clamp and anchor the fans. Thus the cooling fans may be installed or disassembled quickly without using screws.

The foregoing, as well as additional objects, features and advantages of the invention will be more readily apparent from the following detailed description, which proceeds with reference to the accompanying drawings.

DESCRIPTION OF THE PREFERRED EMBODIMENT

Figure 1:
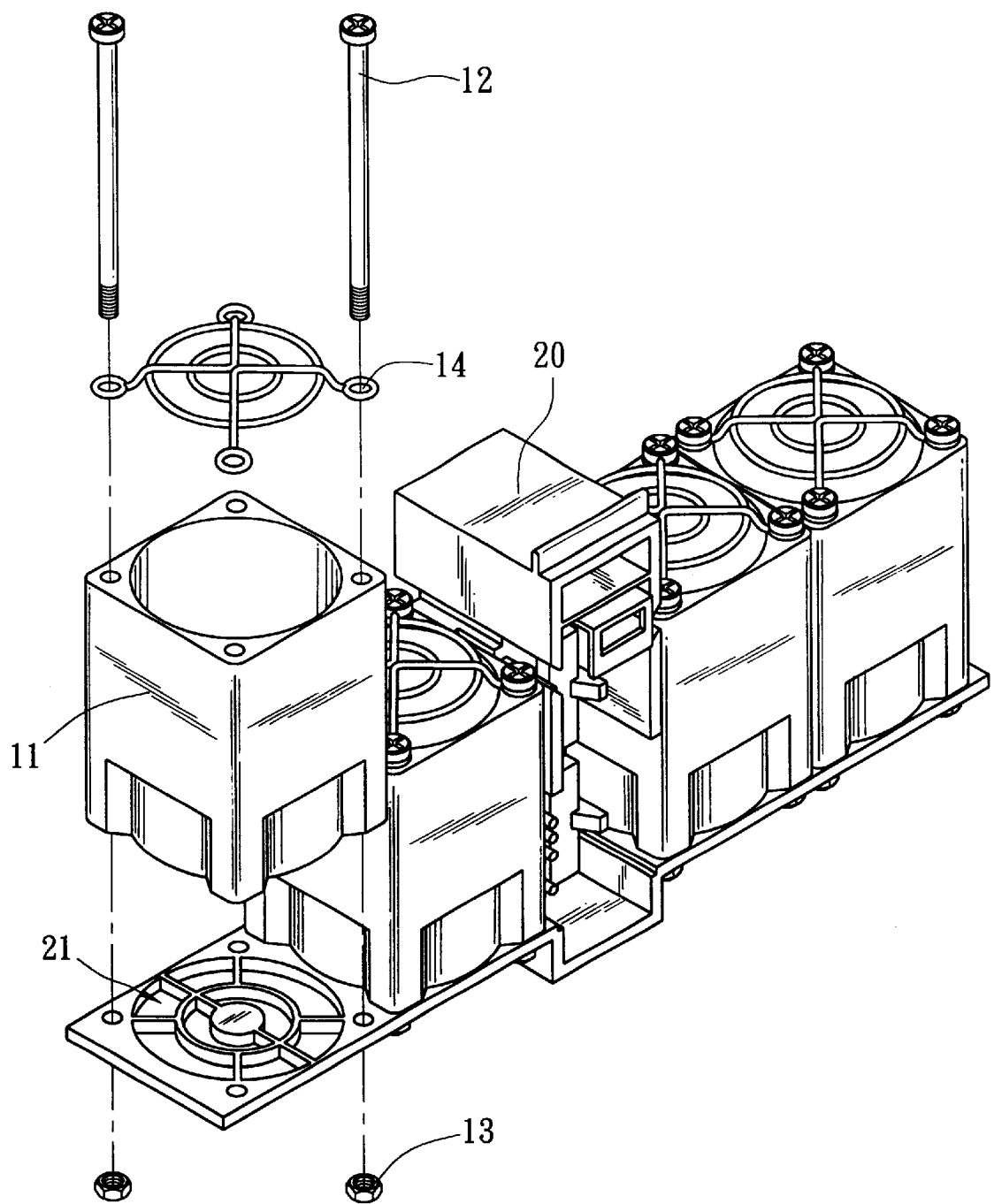
FIG. 1 is a schematic view of a conventional cooling fan module.
Figure 2:
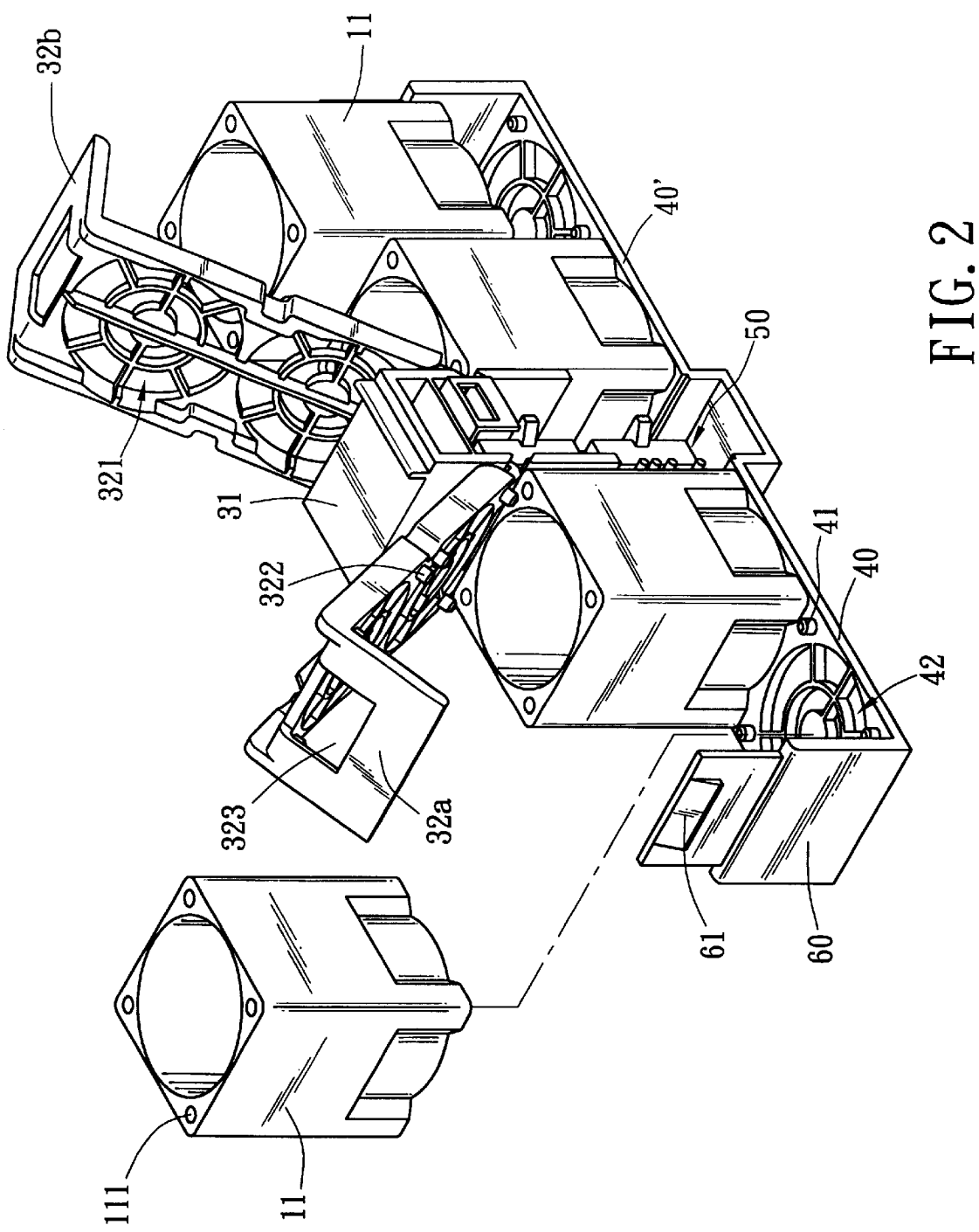
FIG. 2 is a schematic view of the invention for assembly.
Figure 3:
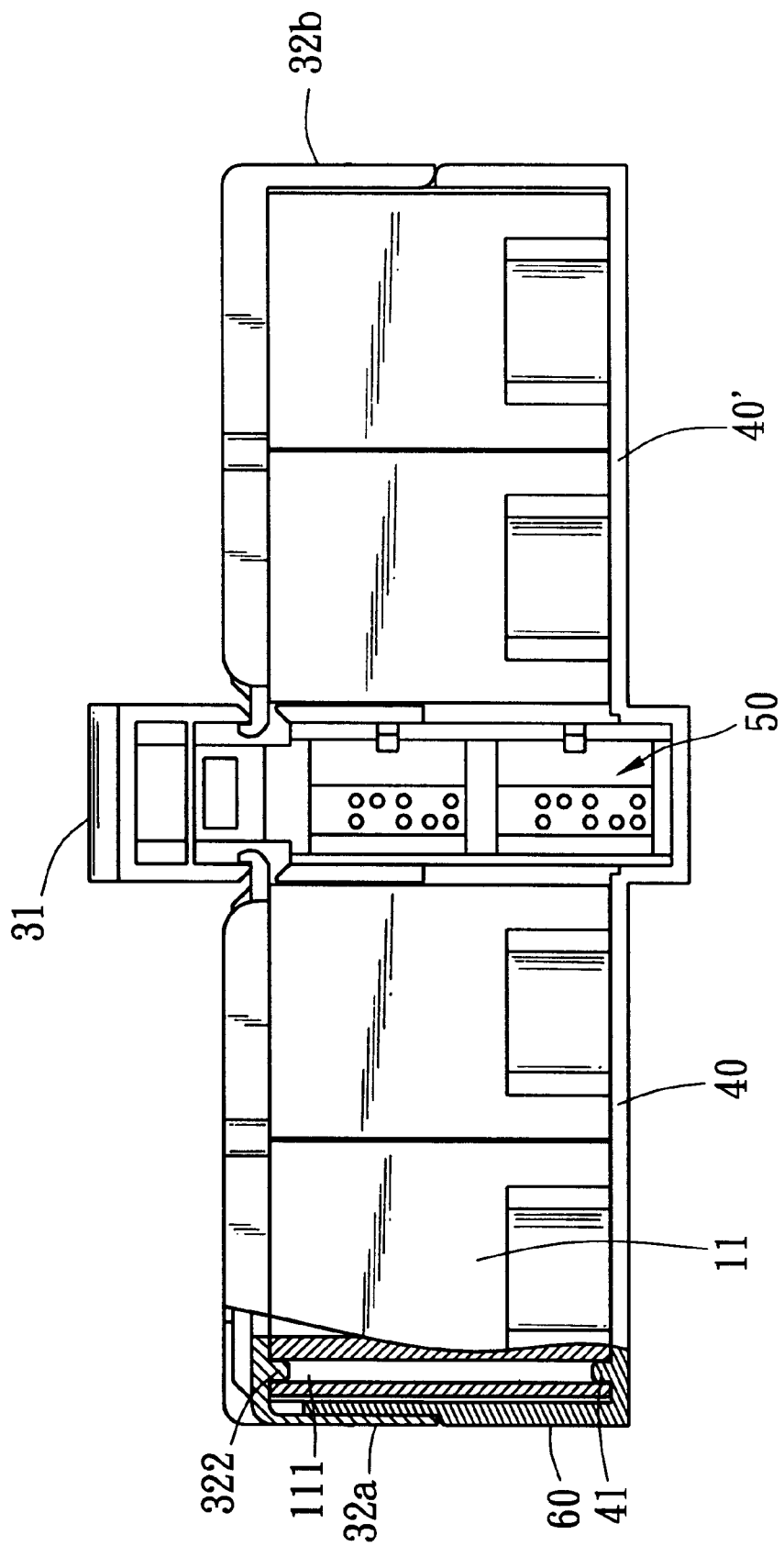
FIG. 3 is a sectional view of the invention, coupled.
Figure 4:
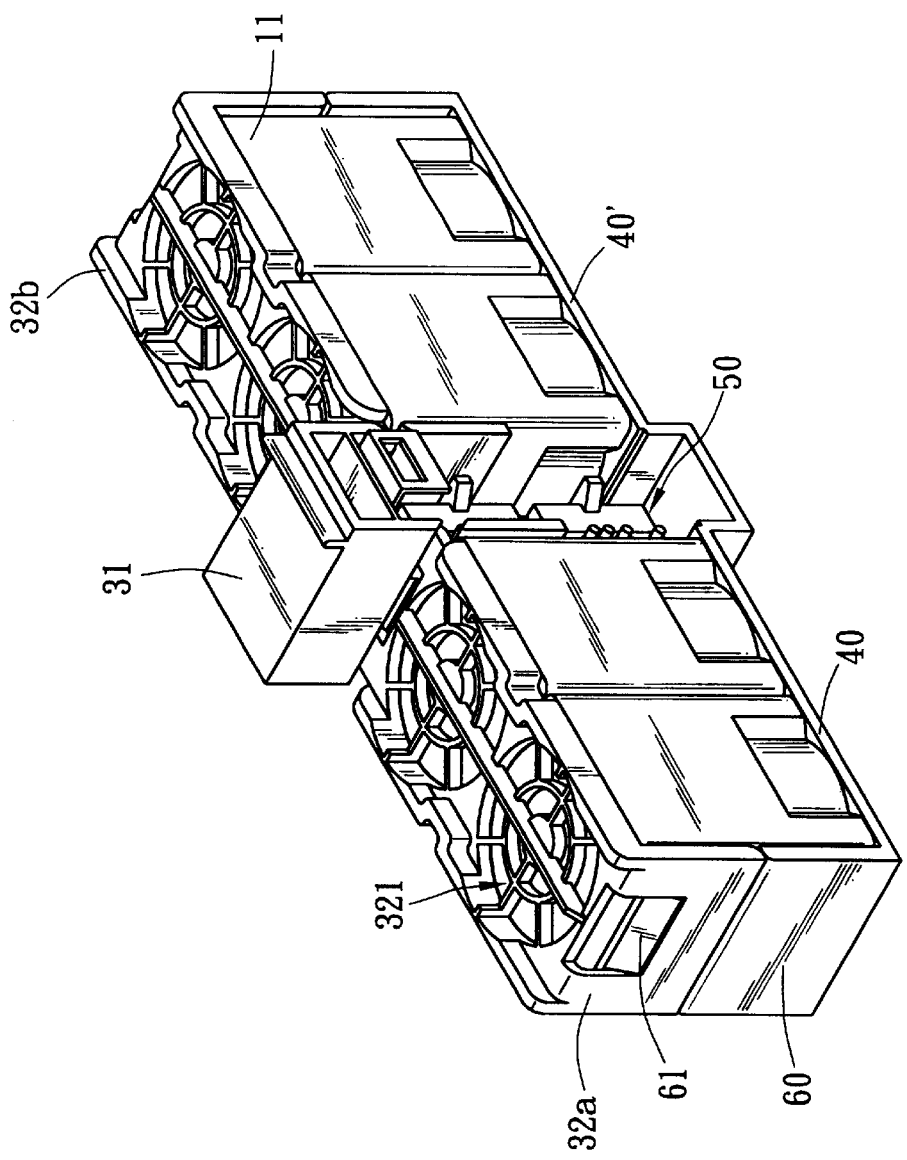
FIG. 4 is a schematic view of the invention, coupled and fastened.

Referring to FIG. 2, the snap coupling cooling fan module of the invention is adopted for use on computer systems, and particularly server systems that require a plurality of fans. The invention adopts a modular design and does not need screws for fastening. It employs snap coupling to anchor the fan and can greatly increase assembly and installation efficiency. The cooling fan module of the invention includes a frame 31, boards 40 and 40', a first fan lid 32a and a second fan lid 32b. The frame 31 has a connector 50 to establish electric connection with the server system. The boards 40 and 40' extend from two sides of the frame 31, and have respectively two fan openings 42. The number of fan openings 42 may be designed according to requirements, and is not limited to two. The number of boards 40 and 40' is also not limited to two, and may be one or many. However, it is preferably two and should be symmetrical on the left and right.

The first fan lid 32a and the second fan lid 32b are substantially the same. Take the first fan lid 32a as an example for description. It has one end pivotally engaged with the frame 31 and another end forming a latch slot 323. The latch slot 323 may be selectively anchored on the board 40. In addition, a guarding grid 321 may be directly formed on the first fan lid 32a (the same approach may be adopted on the fan opening 42 on the board 40). The guarding grid 321 of the first fan lid 32a and the fan opening 42 of the board 40 form a housing space for accommodating the fan 11. As shown in the drawing, each of the boards 40 and 40' can hold two fans 11.

The board 40 has one tail end extended to form a clip flange 60, which has a latch hook 61 formed thereon. The latch hook 61 may snap couple with the latch slot 323 formed on the other end of the first fan lid 31 to anchor the first fan lid 31. Meanwhile, a plurality of anchor stubs 41 are formed on the board 40 around the fan opening 42, and coupling stubs 322 are formed around the guarding grid 321 of the first fan lid 32a to anchor the fan 11.

For installing the fan 11, as shown in FIG. 2, couple the screw holes 111 of the fan 11 to the anchor stubs 41 of the board 40. Then turn the first fan lid 32a until the coupling stubs 322 wedge into the screw holes 111, and engage the latch slot 323 with the latch hook 61 of the clip flange 60 to anchor the first fan lid 32a. The fan 11 may be securely anchored without breaking away. Then couple the connector 50 to the server system to establish electric connection. By means of the construction set forth above, screw bolts may be saved and assembly time may be greatly reduced.

For repairing or replacement, remove the entire cooling fan module from the server system, then unfasten the latch slot 323 of the first fan lid 32a from the latch hook 61 of the clip flange 60. The first fan lid 32a may be turned for removing the fan 11 for repairs or replacement.

In summary, the snap coupling cooling fan module of the invention employs the design of a flipping fan lid, with matching anchor and coupling stubs to anchor and fasten the fan without using screws. Installation and disassembly operations can be done much faster. In addition, the guarding grid may be formed on the fan lid. As a result, the number and cost of the components are reduced. Labor and time required for assembly, repairs and maintenance also decrease.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A snap coupling cooling fan module for anchoring more than one fan on a computer system, comprising:

a frame having a connector to connect electrically with the computer system;

a board extended outwards from the frame having a plurality of fan openings and a plurality of anchor stubs formed around the fan openings; and a fan lid having one side pivotally engaged with the frame and other side selectively anchored on a tail end of the board, and a plurality of openings corresponding to the fan openings, and a plurality of coupling stubs formed around the openings such that the openings of the fan lid and the fan openings of the board form a space therebetween for housing a plurality of the fans;

wherein the fan lid is anchored on the board to enable the anchor stubs of the board and the coupling stubs of the fan lid to engage respectively in screw holes located on two sides of the fan to anchor the fan.

2. The snap coupling cooling fan module of claim 1, wherein the opening of the fan lid has a guarding grid mounted thereon.

3. The snap coupling cooling fan module of claim 1 further having a clip flange located at one side of the fan openings, the clip flange being extended from the board towards the fan lid.

4. The snap coupling cooling fan module of claim 3, wherein the clip flange has a tail end formed a latch hook to engage with an edge of the fan lid.

5. The snap coupling cooling fan module of claim 4, wherein the fan lid has a latch slot to engage with the latch hook to anchor the fan lid.

6. The snap coupling cooling fan module of claim 1, wherein the fan lid is a pair of lids pivotally engaging with two sides of the frame.

7. The snap coupling cooling fan module of claim 1, wherein the anchor stubs are located symmetrically around the fan opening.

8. The snap coupling cooling fan module of claim 1, wherein the coupling stubs are located symmetrically around the opening.

* * * * *